US007158069B2

(12) United States Patent
Confalonieri et al.

(10) Patent No.: US 7,158,069 B2
(45) Date of Patent: Jan. 2, 2007

(54) ANALOG-DIGITAL CONVERTER (75) Inventors: Pierangelo Confalonieri, Caponago (IT); Marco Zamprogno, Cesano Maderno (IT); Francesca Girardi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/097,456

(22) Filed: Apr. 1, 2005

(65) Prior Publication Data
US 2005/0231412 A1 Oct. 20, 2005

(30) Foreign Application Priority Data

Apr. 1, 2004 (EP) .................. 04425241
Apr. 1, 2004 (EP) .................. 04425242

(51) Int. Cl.
*H03M 1/12* (2006.01)
(52) U.S. Cl. ..................... 341/155; 341/144
(58) Field of Classification Search ............... 341/155, 341/163, 144, 166
See application file for complete search history.

(56) References Cited

U.S. PATENT DOCUMENTS

| 3,781,871 | A | * | 12/1973 | Mattern ................ 341/136 |
| 4,388,612 | A | * | 6/1983 | Takagi et al. ............ 341/145 |
| 4,565,976 | A | | 1/1986 | Campbell ................ 331/57 |
| 4,679,028 | A | * | 7/1987 | Wilson et al. ............ 341/120 |
| 4,725,814 | A | * | 2/1988 | Pohl ..................... 341/122 |
| 5,241,312 | A | * | 8/1993 | Long ..................... 341/163 |
| 5,260,705 | A | | 11/1993 | Inukai ................... 341/155 |
| 5,422,807 | A | | 6/1995 | Mitra et al. .............. 364/184 |
| 5,633,639 | A | * | 5/1997 | Hopkins ................. 341/161 |
| 5,757,302 | A | | 5/1998 | Hino .................... 341/155 |
| 6,075,478 | A | | 6/2000 | Abe ..................... 341/155 |
| 6,329,938 | B1 | | 12/2001 | Spaur et al. .............. 341/118 |
| 6,400,302 | B1 | * | 6/2002 | Amazeen et al. .......... 341/172 |
| 6,556,164 | B1 | | 4/2003 | Schmid .................. 341/163 |
| 6,873,272 | B1 | * | 3/2005 | Pezzini .................. 341/120 |

FOREIGN PATENT DOCUMENTS

JP        56-44225        4/1981

* cited by examiner

*Primary Examiner*—Peguy JeanPierre
(74) *Attorney, Agent, or Firm*—Lisa K. Jorgenson; Robert Iannucci; Seed IP Law Group PLLC (57) ABSTRACT The described analog-digital converter comprises quantization means having an input for receiving an analog quantity to be converted, a register having an output for providing a digital quantity corresponding to the analog quantity, a timing pulse generator and logic means connected to the quantization means, the register and the timing pulse generator and capable of responding to a conversion request signal by activating the quantization means in such a manner as to make them carry out predetermined operations timed by the timing pulses and load into the register the digital quantity to be provided at the output. With a view to permitting the converter to function even when a system clock is not available, the timing pulse generator, which is incorporated in the integrated circuit that comprises the rest of the converter, comprises an oscillator capable of being started/stopped by a binary signal applied to its activation input and the logic means are capable of generating a stop signal of the oscillator and comprise means for generating the binary signal to be applied to the activation input of the oscillator. This signal assumes a first or a second binary state corresponding, respectively, to activation and deactivation of the oscillator in response to, respectively, the conversion request signal and the stop signal of the oscillator.

13 Claims, 10 Drawing Sheets

ANALOG-DIGITAL CONVERTER

BACKGROUND OF THE INVENTION

1. Field of the Invention

The present invention relates to an analog-digital converter.

2. Description of the Related Art

Figure 1:
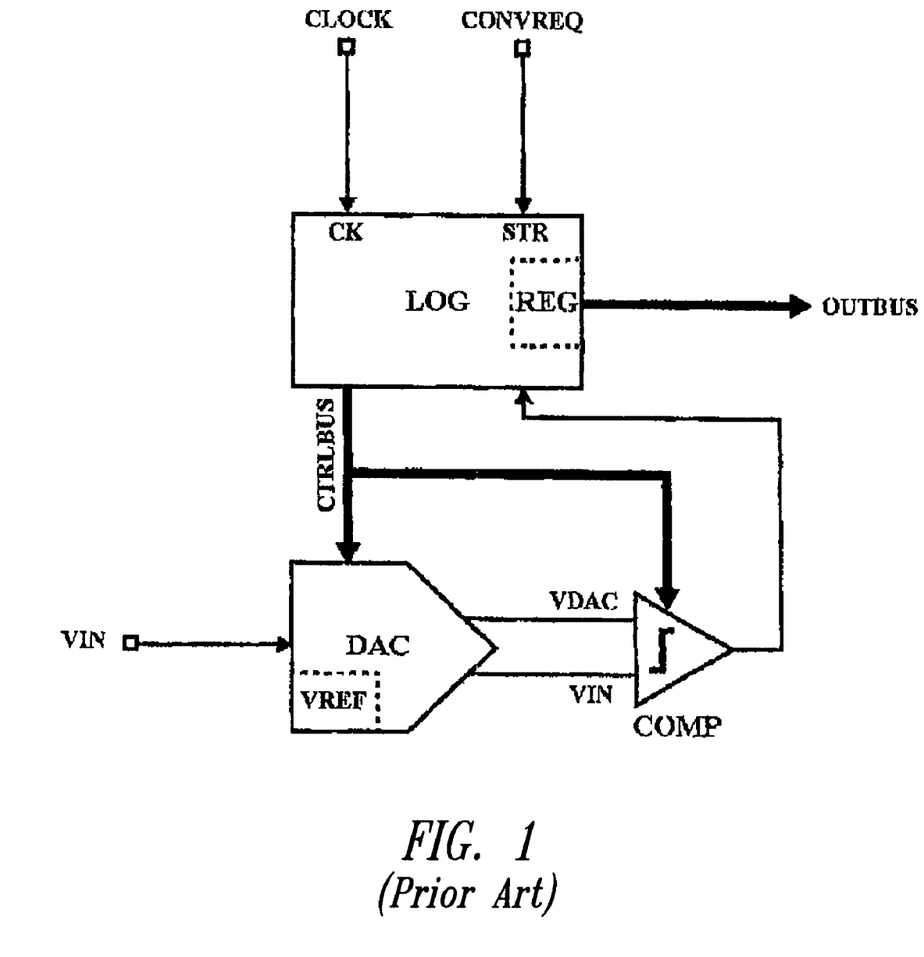
FIGS. 1 and 2 schematically illustrate two known analog-digital converters.

As is well known, an analog-digital converter requires a clock signal for carrying out the quantization of the samples of an analog signal to be converted and performing other timing functions. By way of example, let us consider an analog digital converter of the SAR type (Successive Approximation Register) of which the basic structure is as shown in FIG. 1. It comprises an analog-digital converter DAC (which includes a reference voltage source VREF) and a comparator COMP as elements for the quantization of an input analog quantity to be converted. It also comprises a logic unit LOG (which includes a register REG) with timing and control functions connected to the converter DAC and the comparator COMP by means of a control bus CTRL-BUS. A timing or clock pulse signal (CLOCK) is applied to a terminal CK of the logic unit. An input voltage to be converted VIN is applied to the converter DAC and a conversion request signal CONVREQ is applied to a starting terminal STR of the logic unit LOG. A sequence of clock-pulse timed signals activates the converter DAC and the comparator COMP and makes possible the loading of the sample VIN to be converted. The register REG is set to a digital value corresponding to the centre of the scale of the conversion range (10000000 in the case of an 8-bit register). The converter DAC therefore furnishes an output voltage of VDAC=VREF/2. The comparator COMP compares this voltage with the voltage VIN and provides the result of the comparison to the logic unit. When VIN>VDAC, the comparator output is a logic "1" and the most significant bit of the register remains at "1". But when VIN<VDAC, the output of the comparator is a logic "0" and the most significant bit of the register is switched into a logic "0". The next bit of the register is then set to "1", followed by another comparison with the same criterion, and this is continued until the least significant bit has been examined. At this point the conversion is finished and the register contains the digital code, in this example consisting of 8 bits, corresponding to the input voltage VIN. This code is available at the output OUTBUS of the logic unit LOG and the register REG, which is the output of the converter.

A typical field of application of analog-digital converters is that of cellular telephones. These telephones call for the presence of an analog-digital converter to convert analog signals of various types needed for such control functions as measuring the charging level of the battery, measuring the charging current of the battery, measuring the internal temperature, verifying the presence and the type of accessories connected to the cellular phone, and so on. The number of inputs to be converted is typically of the order of 10–15.

With a converter of this type it is necessary for the sample of the analog signal to be converted to be memorized even in the absence of the conversion clock signal, which is normally obtained from the system clock. The memorization request occurs typically during the charging of the battery while the telephone is switched off and is based on the use of the oscillator that controls the telephone's clock (understood as device for measuring time), but the oscillator frequency is too low to permit its being used as clock signal of the conversion. A known solution, illustrated by FIG. 2, envisages applying the analog voltage VIN to be converted onto a capacitor C by means of a signal STORE supplied by a logic controlled by the oscillator and waiting until the system clock signal becomes available again for activating both the conversion clock and the conversion request. Since the input of the converter DAC is subject to losses, maintenance of the voltage VIN for the whole of the necessary time calls for the use of a relatively large capacitor C that can be integrated only at the price of occupying a very large area of the integrated circuit.

This type of application calls for the lowest possible energy consumption not only during the conversion operations, but also and above all in stand-by conditions.

BRIEF SUMMARY OF THE INVENTION

One object of the present invention is to propose an analog-digital converter that can function also when the system clock signal is not available.

Another object is to propose an analog-digital converter that has a very low consumption both during the conversion and in stand-by conditions.

These objects are attained by realizing the converter defined in general terms in claim 1 and by the specific embodiments of the dependent claims.

BRIEF DESCRIPTION OF THE SEVERAL VIEWS OF THE DRAWINGS

The invention will be understood more clearly from the following detailed description of some embodiments thereof, which are given solely by way of example and are not to be regarded as limitative in any way, the description making reference to the attached drawings, of which.

DETAILED DESCRIPTION OF THE INVENTION

Figure 3:
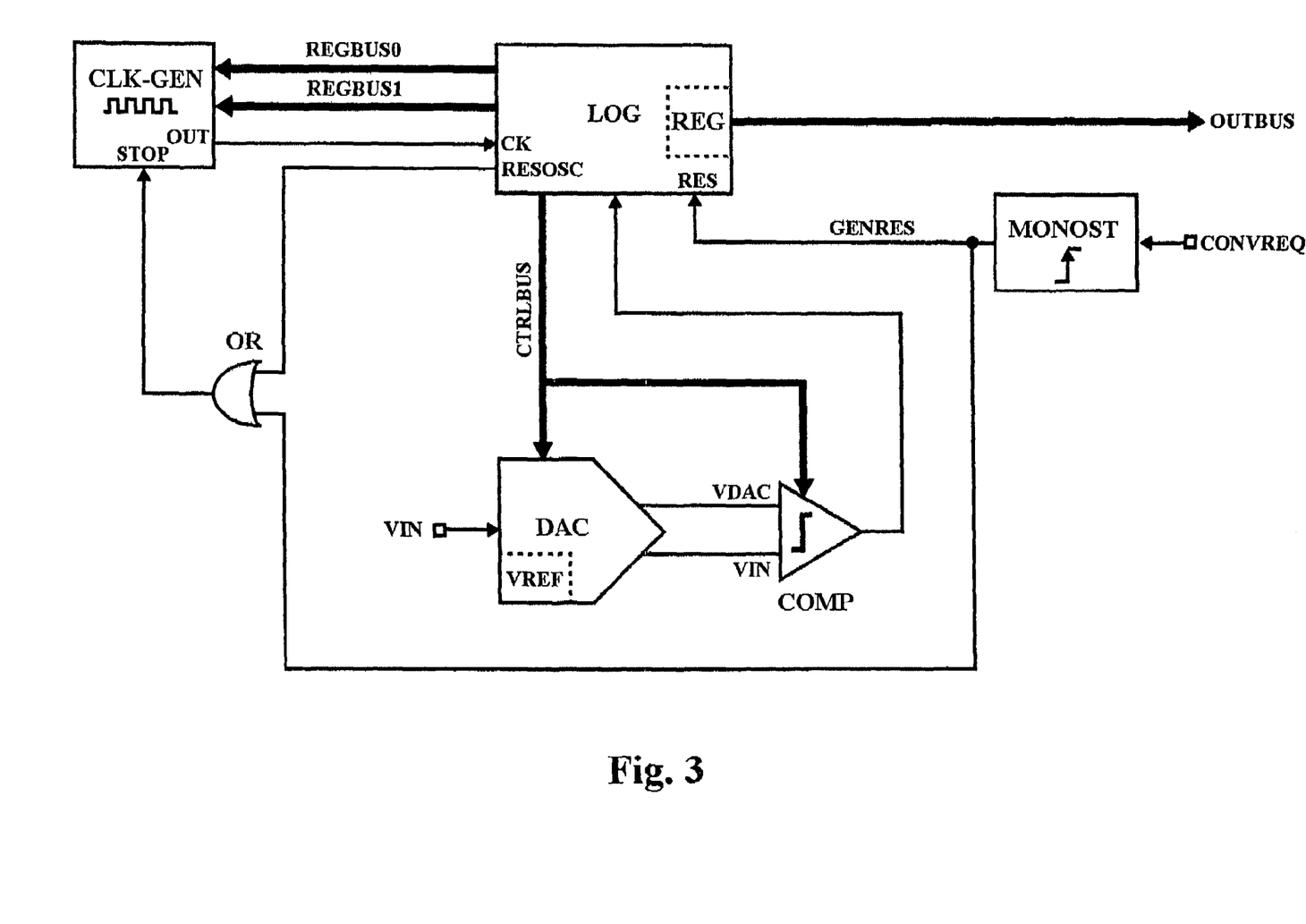
FIG. 3 shows the schematic layout of an analog-digital converter in accordance with a first embodiment of the invention.

The converter of FIG. 3 comprises some functional blocks substantially equal to some functional blocks of the converter of FIG. 1, namely the DAC and the COMP, and therefore indicated by the same names, there are three additional function blocks, a clock-pulse generator, indicated by CLK-GEN, a single-pulse generator, in this example a monostable analog circuit MONOST, and an OR logic gate. Further, the logic unit LOG has in addition an output, indicated by RESOSC, for a stop signal of the generator CLK-GEN and two outputs, REGBUS0 and REG- BUS1, for regulating the functioning parameters of the generator itself. It should further be noted that the logic unit LOG has a starting terminal, here indicated by RES, which also performs a reset function, as will be explained further on.

The generator CLK-GEN has an output terminal OUT connected to the clock terminal CK of the logic unit LOG, an input activation terminal STOP connected to the output of the OR gate and two inputs connected to the logic unit by means of the two buses REGBUS0 and REGBUS1. The monostable circuit has an input terminal to which there is applied the conversion request signal CONVREQ and an output terminal GENRES connected to the starting and resetting terminal RES of the logic unit and to an input terminal of the OR gate. The latter has a second input terminal connected to the output terminal RESOSC of the logic unit.

The generator CLK-GEN and the quantization elements DAC and COMP are incorporated in one and the same integrated circuit. Preferably, the other circuit blocks of FIG. 4 will also form part of the same integrated circuit. Namely, in a preferred embodiment, all elements of FIG. 3 are formed in the same semiconductor substrate and therefore all are part of the same integrated circuit.

The generator CLK-GEN is a pulse generator that becomes active when a binary signal applied to its input STOP is in a first predetermined state of its two logic states and on its output terminal OUT produces an oscillation that can immediately be used because it is not affected by transitory phenomena. Furthermore, when the signal at its input terminal STOP switches to the other of the two logic states, it stops in a known condition, i.e., all its nodes always have the same predetermined binary values; therefore, when it is restarted (STOP=0), it does so with an oscillation of the correct value right from the first half-period. A generator of this type is described in European Patent Application No. 04425100.7 filed by applicants on 18 Feb. 2004 under the title "Clock-pulse generator circuit" and is also briefly described hereinbelow with reference to FIGS. 5, 6 and 7.

Figure 5:
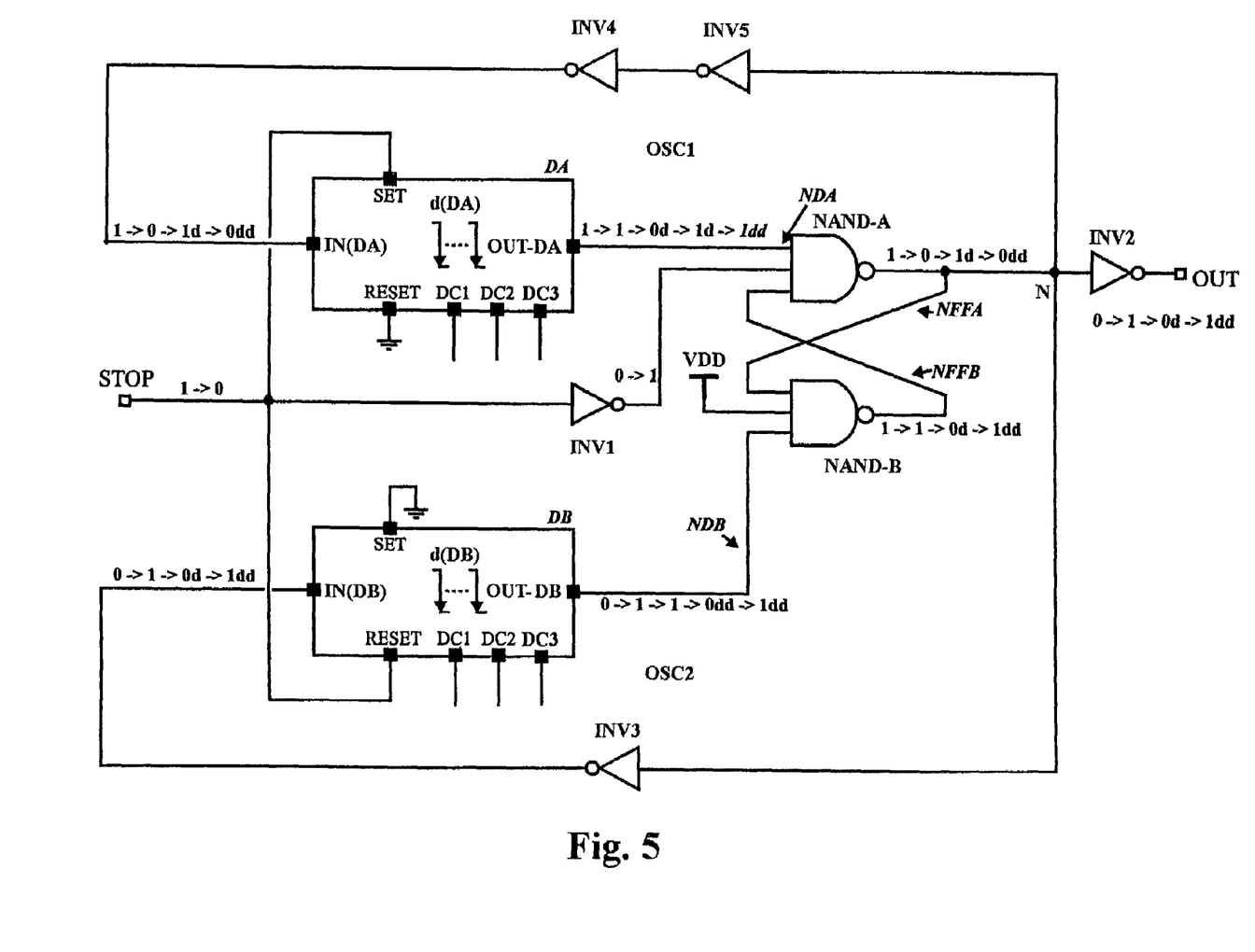
FIG. 5 shows the schematic layout of a clock-pulse generator that can be used in the converter of FIG. 3.

As can be seen in FIG. 5, the generator CLK-GEN comprises two ring oscillators OSC1 and OSC2 that have a common node N connected by means of a buffer, in this example an inverter INV2, to the output terminal OUT of the circuit. The oscillator OSC1 comprises two inverters INV4 and INV5 connected in cascade between the node N and the input IN(DA) of a delay element DA, in this example of the type capable of responding to an input pulse with a predetermined delay d(DA) with respect to the trailing edge of the input pulse and practically without delay with respect to the leading edge of the input pulse. The oscillator OSC2 comprises an inverter INV3 connected between the node N and the input IN(DB) of another delay element DB wholly similar to the delay element DA. The circuit also comprises a bistable logic circuit or flip-flop, in this example formed by two NAND logic gates, indicated by NAND-A and NAND-B, connected to the two oscillators in such a manner as to constitute an inverting element for one of the two rings and two inverting elements for the other. More particularly, the gate NAND-A has its output connected to the common node N and the two gates have their respective outputs each connected to an input of the other NAND gate and each also has another input connected to the output of, respectively, the delay element DA and the delay element DB: when it is in one of its stable states, the flip-flop will therefore close the ring of the oscillator OSC1 with an inverting element and, when it is in the other of its two stable states, closes the ring of the oscillator OSC2 with two inverting elements. The flip-flop has a habilitation terminal constituted by a third input of the gate NAND-A. This third input is connected to the output of an inverter INV1 that has its input connected to an activation/deactivation control terminal and is indicated by STOP in the schematic layout of FIG. 3. The gate, NAND-B has a third input connected to a terminal to which there can be applied a fixed voltage, for example the supply voltage VDD of the circuit, so that it will always be maintained at the logic value 1.

Each of the two delay elements DA and DB has an activation terminal, indicated by SET, and a deactivation terminal, indicated by RESET, that serve to force the respective outputs to 1 or 0; more particularly, the output of a delay element is either stable at the logic value 0 when the RESET terminal is at the logic value 1 or is stable at the logic value 1 when the terminal SET is at the logic value 1. In this example the terminal SET of DA and the terminal RESET of DB are connected to the activation/deactivation terminal STOP and the terminal SET of DB and the terminal RESET of DA are connected to ground, so that when STOP=1, the output of DA is stable at 1 and the output of DB is stable at 0, whereas when STOP=0, both the output of DA and the output of DB depend on the state of their respective inputs. Each of the two delay elements DA and DB also has other inputs, in this example three, indicated by DC1, DC2 and DC3, that serve to set the delay. The inputs DC1, DC2 and DC3 of the delay element DA and those of the delay element DB are connected to the logic unit of the system of FIG. 3 by means of, respectively, the buses REGBUS0 and REGBUS1.

Figure 6:
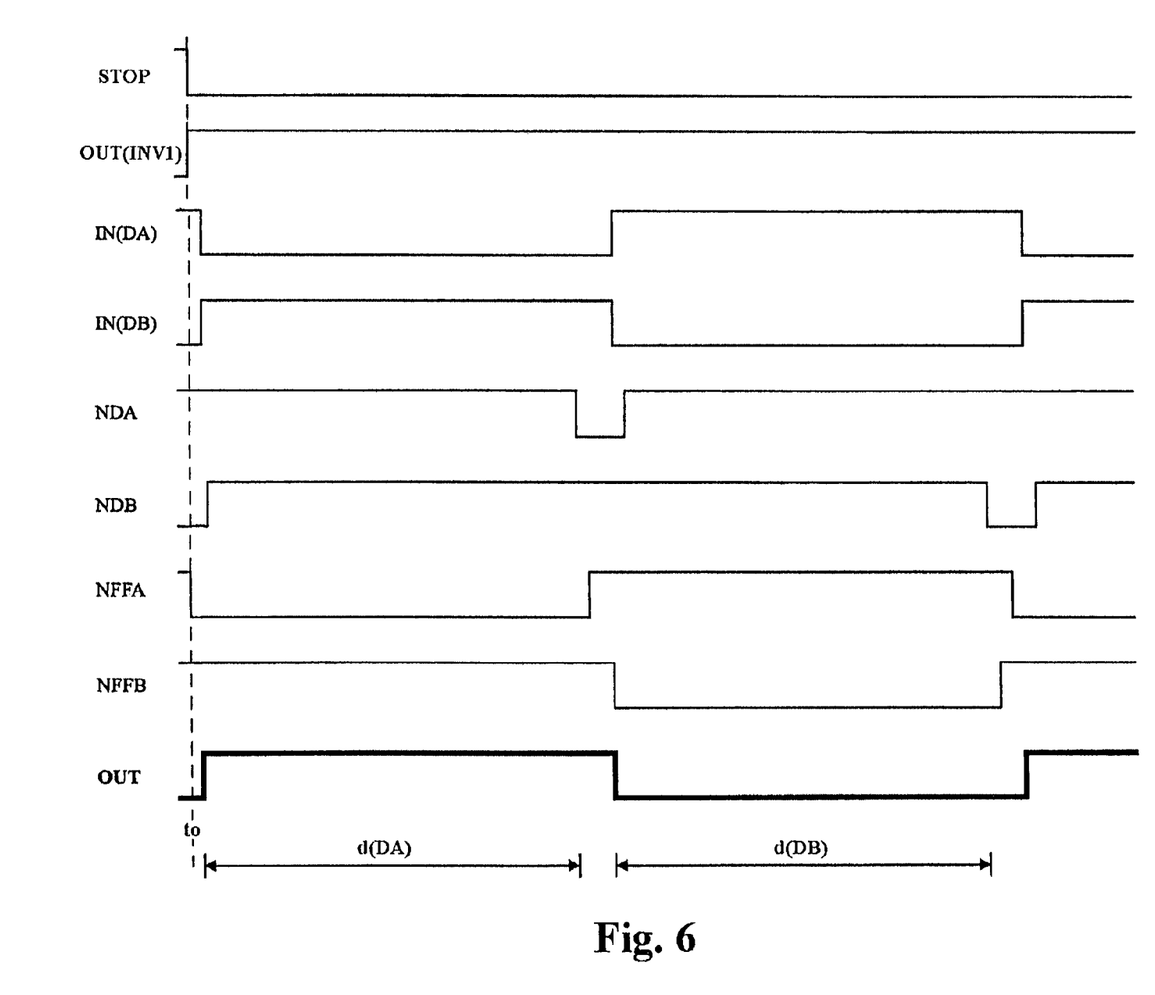
FIG. 6 shows some waveforms that illustrate the functioning of the converter of FIG. 5.

Let us now consider the functioning of the circuit of FIG. 5 with reference to the waveforms shown in FIG. 6, bearing in mind that the time relationships between the various waveforms shown are only indicative, because not all the delays associated with the various elements have been taken into consideration in a rigorous manner. With a view to facilitating understanding of the functioning, FIG. 5 shows the successive logic states (0,1) of the principal nodes of the circuit, followed where appropriate by one or more letters "d" to indicate a delayed change of state.

The circuit is activated when the binary signal STOP changes state, passing from 1 to 0. For as long as STOP=1, the output NDA of the delay element DA is equal to 1 because SET=1, the output NDB of the delay element DB is equal to 0 because RESET=1, the output NFFA of the gate NAND-A is equal to 1 (because at least one of its inputs, the one connected to the output of the inverter; INV1, is equal to 0), the output NFFB of the gate NAND-B is equal to 1 because at least one of its inputs, the one connected to the output of the delay element DB, is at 0, and the output OUT of the oscillator is equal to 0.

When STOP switches from 1 to 0 at the instant $t_o$, the two delay elements DA and DB are habilitated to respond to signals applied to their respective inputs IN(DA) and IN(DB). It should be noted that before STOP switches from 1 to 0, the input IN(DA) is equal to 1 due to the effect of the double inversion of the signal present at NFFA and the input IN(DB) is equal to 0 due to the effect of the inversion of the signal present at NFFA. As son as STOP=0, the output of INV1 (OUT(INV1) in FIG. 6) switches from 0 to 1, and therefore the inputs of NAND-A are all at 1 (NFFB=1 and NDA remains unchanged at 1 for a period of time determined by the delay element DA), the output of NAND-A, i.e., NFFA, switches from 1 to 0 and the output OUT switches from 0 to 1. The input IN(DA) switches from 1 to 0, the input IN(DB) of DB switches from 0 to 1. The output of DB, i.e., NDB, switches from 0 to 1 after a brief delay with respect to the leading edge of the input signal IN(DB) and the output NFFB remains at 1 (because at least one of its inputs, the one connected to NFFA, is equal to 0). Following a time equal to the delay d(DA) of DA, the output NDA of DA switches from 1 to 0, so that the output NFFA of NAND-A switches from 0 to 1, the output NFFB of NAND-B switches from 1 to 0 because all its inputs are now at 1 (NDB remains equal to 1 for a time d(DB) determined by the cell DB), OUT switches from 1 to 0, the input IN(DA) of DA switches from 0 to 1 and the output NDA of DA, which had just passed to 0, returns to 1 after a very brief period of time because the delay of DA on the leading edge of the input is very brief, the input IN(DB) of DB switches from 1 to 0, while the output NDB remains at 1 for the whole of the delay time d(DB). When the delay d(DB) comes to an end, NDB switches to 0, NFFB switches to 1, NFFA switches to 0 (because all the inputs of the gate NAND-A are now at 1), OUT switches to 1, the input IN(DA) of DA goes to 0 and NDA remains at 1, the input IN(DB) of DB switches from 0 to 1, while the output NDB-returns to 1 with the brief delay associated with the leading edge of the input signal. The network is now in the same condition in which it was just after the instant $t_o$ (at the beginning of the delay time d(DA)) and continues to oscillate between the two states 0 and 1 for as long as STOP remains equal to 0. As soon as STOP switches from 0 to 1, the output NDA of the delay element DA goes to 1 and remains there, while the output NDB goes to 0 and remains there, so that we again have the situation illustrated at the beginning of the description of the manner in which the circuit functions.

It should be noted that if the oscillation is to be guaranteed, all that is necessary is that the delay introduced by the two inverters INV4 and INV5, or the delay introduced by the inverter INV3, plus the brief delay of the response of a cell (DA) or DB) to the leading edge of a pulse at its input (switch from 0 to 1) should be greater than the switching time of the flip-flop.

It is clear from what has been explained above that the circuit of FIG. 5 responds to an activation signal (STOP=0) by immediately causing the output to switch (from 0 to 1) and generating clock pulses having a predetermined period and duty cycle without any initial transient. The period is determined by the sum of the time delays (d(DA)+d(DB)) of the delay elements DA and DB and the duty cycle is determined by the ratio between one of the two delays and the sum of the two delays.

Figure 7:
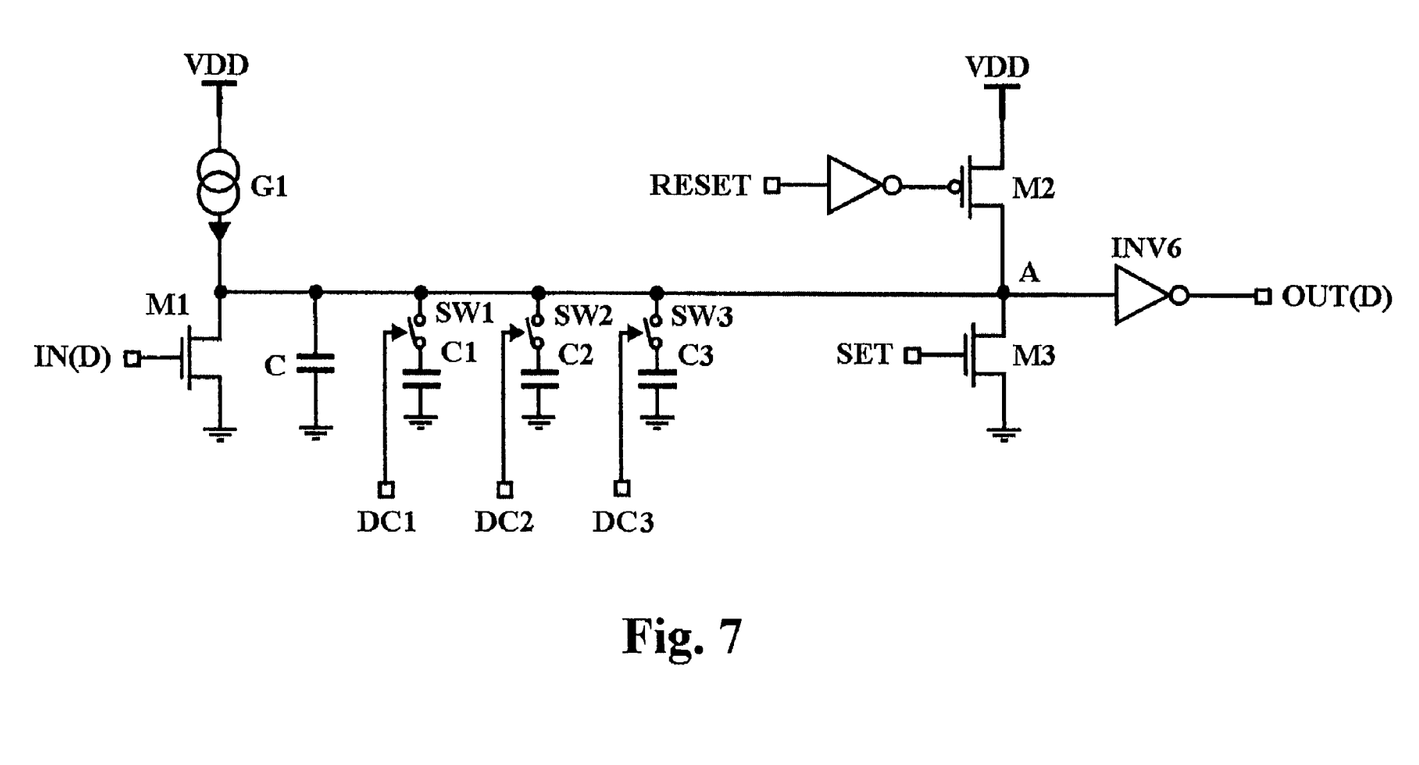
FIG. 7 shows the schematic layout of a delay element that can be used in the generator of FIG. 5.

The delay elements may be circuits that respond to a predetermined edge of a binary input signal, i.e., to a transition from one of the two predetermined binary logic states to the other, with a delay that is a function of the ratio between a capacitance C and a current I. A known circuit of this type in which the transition from 1 to 0 is delayed and in which the delay may be regulated is schematically illustrated by FIG. 7. It comprises a group of capacitors (which in this example are four in number, but could also be less or more than four) connected or capable of being connected to the input A of an inverter INV6. The capacitors are connected between the node A and ground; more precisely, one of them, indicated by C, is connected directly between the node A and ground and the other three, indicated by C1, C2 and C3, can be connected to the node A via respective electronic switches SW1, SW2 and SW3 controlled by binary logic signals applied to their respective control terminals DC1, DC2 and DC3. An N-channel MOS transistor, indicated by M1, and a constant current generator G1 connected in series with each other between the terminals of the supply source (ground and VDD) make it possible to control the charge of the capacitors. The input and output terminals IN(D) and OUT(D) of the time delay circuit are, respectively, the gate terminal of the transistor M1 and the output terminal of the inverter INV6. The node A is also connected via an N-channel MOS transistor, indicated by M3, to ground and, via a P-channel MOS transistor, indicated by M2, to the supply terminal VDD. The gate terminal of the MOS transistor M3 is connected to an activation terminal SET of the delay circuit and the gate terminal of the transistor M2 is connected via an inverter to a deactivation terminal RESET of the delay circuit.

According to a likewise known variant (not shown) of the delay circuit of FIG. 7, the constant current generator G1 is substituted by a resistor, so that the delay is a function of the product of the resistance of the resistor and the capacitance of the capacitors connected to the input of the inverter.

Referring to the circuit of FIG. 7, let us first consider the case in which SET=0 and RESET=0, i.e., the case in which both M3 and M2 are not conducting. When IN(D)=1, the transistor M1 conducts, so that the node A is substantially at ground potential (binary state 0), the capacitors connected to the node A are discharged and, due to the effect of the inverter INV6, the output OUT(D) of the delay circuit is a positive voltage, typically the supply voltage VDD (binary state 1). When the input signal IN(D) passes from 1 to 0, the transistor M1 ceases to conduct and the capacitors begin to charge through the generator G1. When the voltage at the node A attains the switching threshold voltage of the inverter INV6, the output OUT(D) of the delay circuit passes from the supply voltage VDD to ground potential. The time that elapses between the moment when the trailing edge of the signal IN passes from 1 to 0 and the switching instant of the inverter, i.e., the delay time of the circuit, obviously depends on the threshold voltage of the inverter. The delay time may be modified by closing or opening one or more of the switches SW1, SW2, SW3 connecting the capacitors C1, C2, C3 by means of signals applied to DC1, DC2, DC3. The output OUT(D) of the delay circuit may be forced to 1 or to 0 by using the alternative settings of RESET=0 and SET=1 or RESET=1 and SET=0.

Another delay circuit that can be used for the delay elements DA and DB of the clock-pulse generator of FIG. 5 is described in European Patent Application No. 04425083.5 filed by applicants on 10 Feb. 2004 under the title "Time-delay circuit". This circuit makes it possible to obtain a time delay substantially insensitive to the variation of the manufacturing parameters and the operating temperature of the integrated circuit of which it forms part and it can therefore be used with advantage in place of the one shown in FIG. 7 in all cases in which the variability of the manufacturing parameters and the temperature exert a significant effect upon the delay it is desired to obtain.

Figure 4:
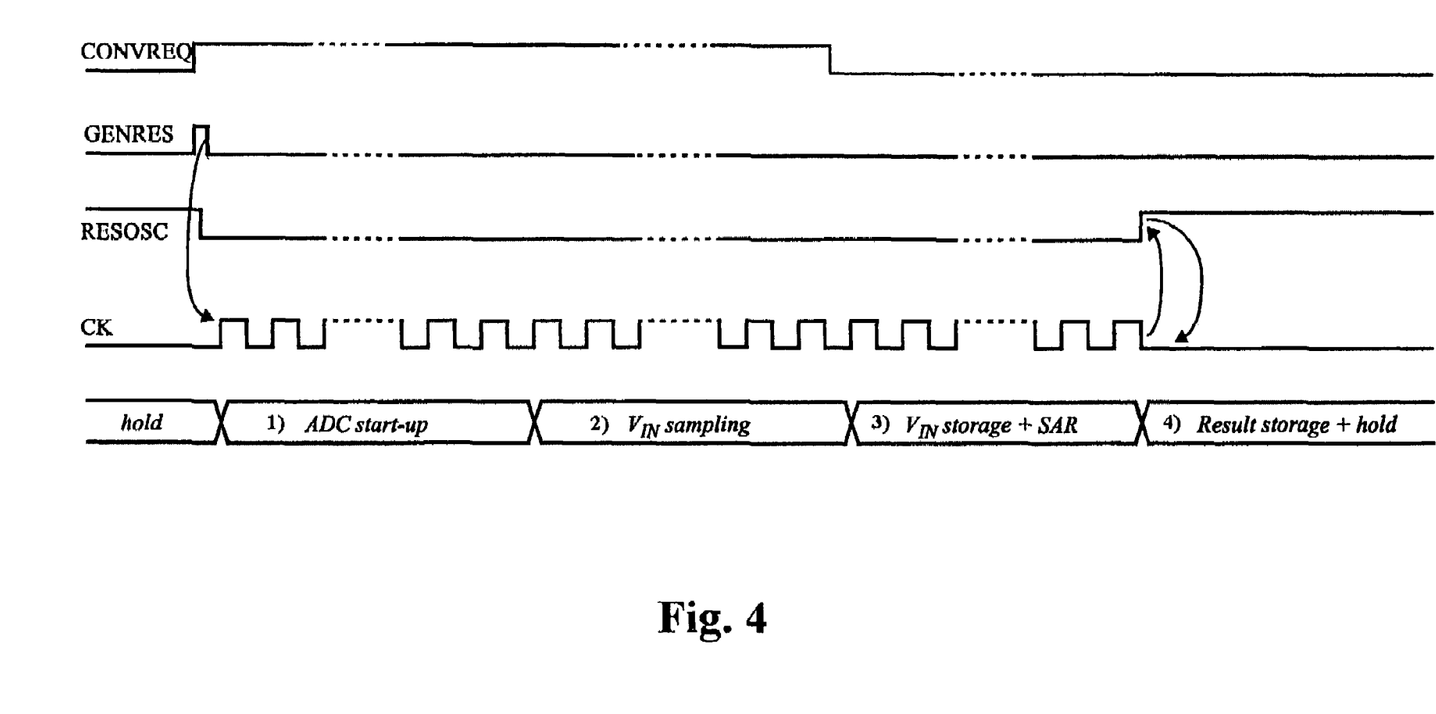
FIG. 4 shows some waveforms that illustrate the functioning of the converter of FIG. 3.

Coming back to FIG. 3, let us now consider the functioning of the converter with reference to the waveforms shown in FIG. 4.

Following a conversion request, the monostable circuit generates a pulse GENRES of predetermined duration. In this example the pulse GENRES is produced when the signal CONVREQ applied to the input of the monostable circuit switches from 0 to 1 and has a duration sufficient to set the logic unit LOG in its initial condition. In practice the signal GENRES brings a counter contained in the logic unit back to 0, sets the output RESOSC to 0 (for example by means of a flip-flop, controlled by the signal GENRES, that will maintain the set state even after the end of the signal GENRES) and prevents the activation of the oscillator for the whole of its duration. Indeed, it should be noted that the generator will not oscillate for as long as STOP=1, i.e., both with RESOSC=1 and GENRES=1, while it will oscillate when STOP=0, i.e., only when the two inputs of the OR gate (RESOSC and GENRES) are both at 0. It should also be noted that in this way the start-up of the oscillator is delayed by a time equal to the duration of the pulse GENRES. When the pulse of the monostable circuit terminates(GENRES=0), the generator produces a clock signal CK that has a frequency and a duty cycle determined by the current of the constant current generator (G1 in FIG. 7) and the capacitance selected by means of REGBUS0 and REGBUS1 until RESOSC returns to 1 and brings the generator to a halt (STOP=1). During the activity of the generator the clock signals increase the contents of the counter of the logic unit LOG, giving rise to the successive emission of the signals needed to cause the quantization elements (DAC, COMP) to perform the operations, timed by the timing pulses, for the conversion of the analog input sample VIN into a digital code. Starting from an initial condition of deactivation (hold) of all the circuits, during which the consumption of the device is only such as is due to the leakage currents, the conversion is performed in accordance with the following phases:

1) ACDstart-up: activation of the analog parts of the converter (DAC, reference voltage source, comparator COMP, possible biasing circuits);

2) VINsampling: the voltage signal VIN to be converted is loaded in a capacitor array of the converter DAC;

3) VINstorage+SAR: the voltage VIN is memorized and the SAR procedure for the determination of the digital code corresponding to VIN is commenced;

4) Resultstorage+hold: the result is conveyed onto the output bus OUTBUS, the pulse generator is stopped and the analog parts are deactivated following an appropriate command of the logic unit.

At the beginning of Phase 4) the trailing edge of the clock signal assures that the counter of the logic unit LOG will cause the signal RESOSC to switch to 1 (and also the transfer of the digital code resulting from the conversion to the bus OUTBUS and the deactivation of the circuits). The generator will therefore have STOP=1 at the activation input, so that the output OUT switches to 0 and the clock signal stops after the pulse that brought about the condition RESOSC=1: from this it follows that the logic unit LOG will cease all activity on account of the lack of a clock signal. This state is maintained until a new leading edge of the conversion request signal CONVREQ. The number of clock pulses for each phase depends on the circuit characteristics and parameters.

In the example described in relation to FIGS. 3 and 4 we considered a clock signal with a duty cycle of 50%, but it is clear that this duty-cycle value may be changed to any selected value, even while the generator is functioning, by appropriately changing the digital codes that the logic unit sends to the clock pulse generator on the buses REGBUS0 and REGBUS1.

Figure 8:
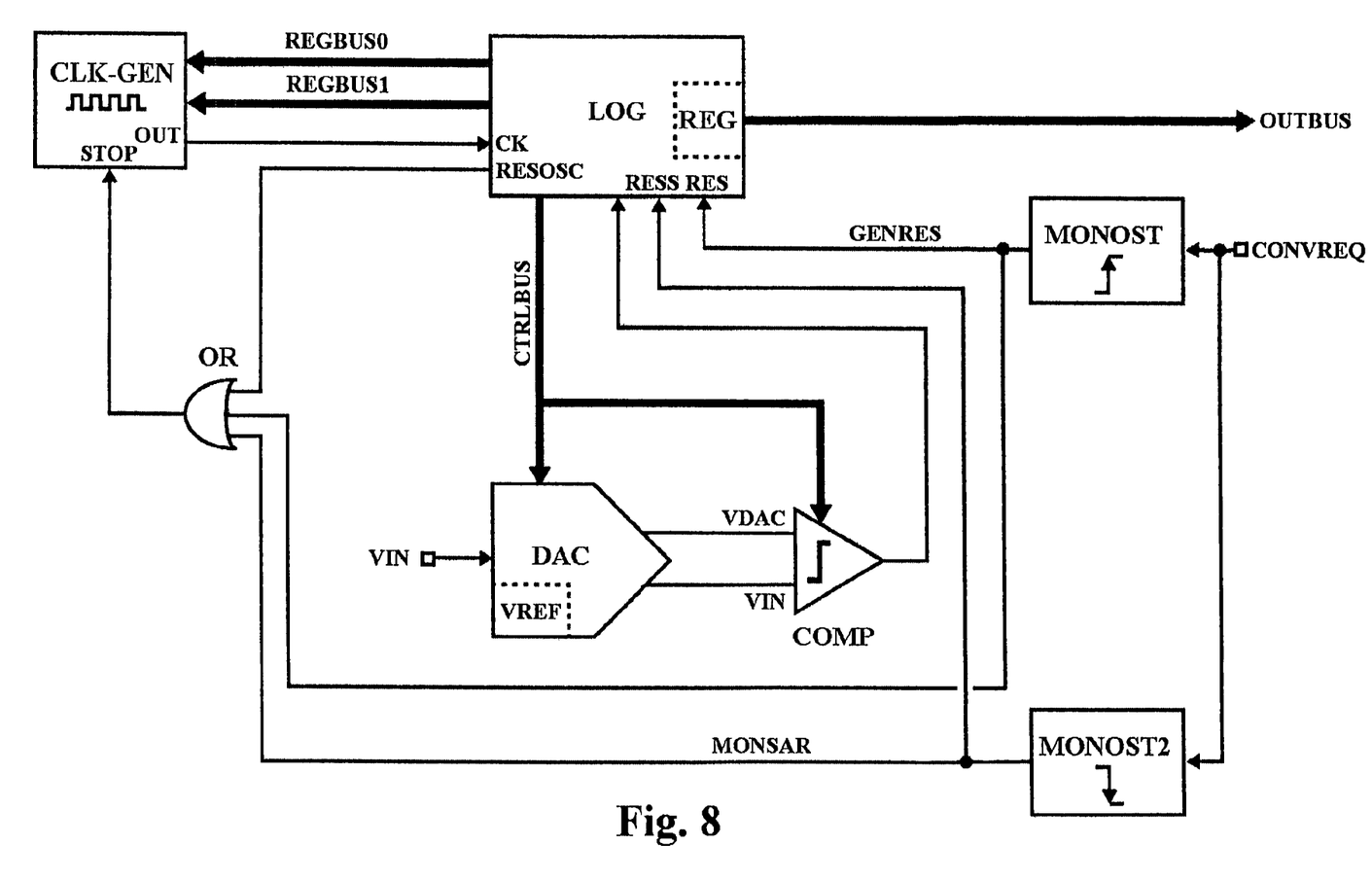
FIG. 8 shows the schematic layout of an analog-digital converter in accordance with a second embodiment of the invention.
Figure 9:
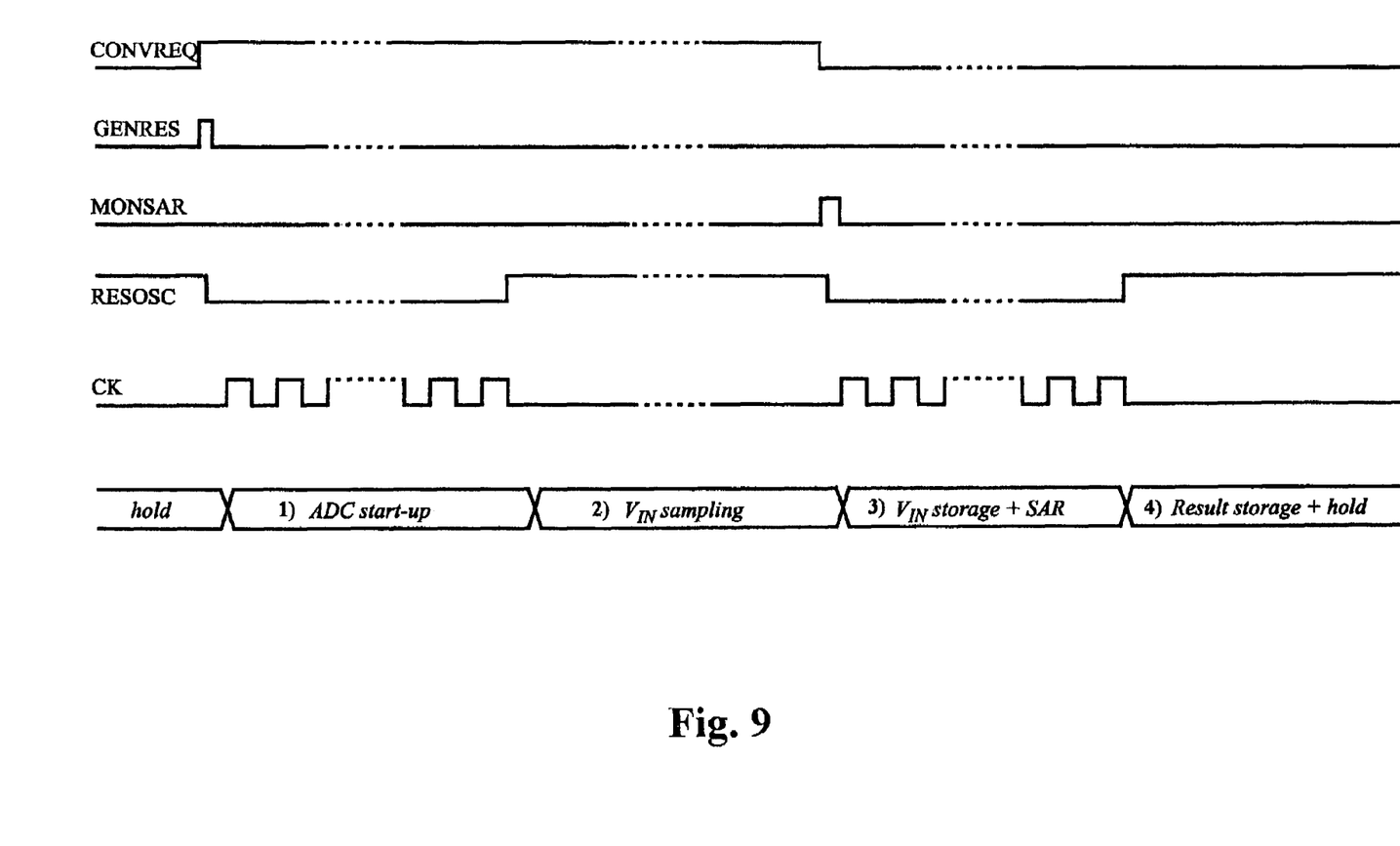
FIG. 9 shows some waveforms that illustrate the functioning of the converter of FIG. 8, and FIG. 10 schematically illustrates the structure of a cellular telephone.

Let us now consider the embodiment illustrated by FIG. 8. The converter of FIG. 8 comprises a variant that makes the use of the converter particularly advantageous when the instant of memorizing the sample of the analog quantity to be converted, i.e., the beginning of Phase 3), has to be defined with great precision with respect to the conversion request (leading edge of the signal CONREQ). This accuracy cannot be assured by the converter in accordance with FIG. 3 because, due to the variability of the manufacturing parameters, the memorization instant varies in general from one specimen to another of the integrated circuit that contains the converter. The schematic layout of FIG. 8 differs from the one of FIG. 4 only by virtue of the fact that it comprises another monostable circuit that has its input connected to the conversion request terminal and its output connected to a terminal of the logic unit LOG, indicated by RESS, and to a third input of the OR gate and is of the type capable of responding to the trailing edge of the signal applied to its input.

The logic unit LOG, unlike the one of FIG. 3, is programmed in such a manner as to interrupt the functioning of the generator CLK-GEN during the whole of Phase 2), this in consideration of the fact that the clock signal is not needed during this phase, because the memorization instant is determined by an external command (and, more precisely, by the instant in which CONVREQ switches from 1 to 0). In particular, the logic unit LOG causes the switching (from 0 to 1) of the signal RESOSC just before the beginning of Phase 2), i.e., the phase of loading the sample to be converted VIN in the array of capacitors of the converter DAC. When RESOSC=1, the oscillator comes to a halt, because STOP=1. In the example illustrated by FIG. 3 the conversion request signal, i.e., the time in which CONVREQ=1, may typically have any duration, always provided that it is shorter than the time needed to carry out all the conversion operations.

In the example of FIG. 8 the duration of this signal is chosen in such a manner that its trailing edge will arrive at a predetermined instant a little time before the instant in which it is desired to commence Phase 3). The switching of the signal CONVREQ from 1 to 0 causes the generation of a pulse, indicated by MONSAR on the drawings, at the output of the monostable circuit MONOST2. The pulse MONSAR is applied to the input RESS of the logic unit LOG and to an input of the OR gate. The logic unit responds to the leading edge of the pulse MONSAR by causing the signal RESOSC to switch to 0, though without resetting the counter, which remains in the state in which it was at the instant of the switch to 1 of RESOSC prior to Phase 2). Of the three inputs of the OR gate, two (GENRES and RESOSC) are now at 0 and the third (MONSAR) is at 1. At the end of the pulse MONSAR all three of the inputs of the OR gate are at 0, so that the activation input of the generator is in the state 0 and the oscillation may therefore recommence. It should be noted that, in this case once again, the start-up of the oscillator is delayed for a time equal to the duration of the pulse (MONSAR) emitted by the monostable circuit MONOST2. The counter of the logic unit LOG resumes its count to commence and manage Phase 3) of the memorization of the sample VIN and the carrying out of the SAR procedure. The conversion then continues in the manner described in connection with FIG. 4 until RESOSC switches to 1, that is to say, until the converter stops in expectation of a new conversion request.

The embodiment described above not only makes it possible for the converter to be employed in the cases in which the sampling instant has to be defined with precision, but also offers the advantage of a substantial energy saving, because the clock-pulse generator ceases to function for the whole of Phase 2).

As brought out by what has been explained above, the analog-digital converter in accordance with the invention fully satisfies the requirements of the applications described at the beginning of this description because, thanks to its capacity of generating clock pulses in an autonomous manner by means of an incorporated generator, it can function in a manner that is wholly independent of the system clock. It also makes it possible to optimize the consumption of electric energy for the following reasons:

the clock-pulse generator comes into operation only when there is a conversion request, so that its consumption in stand-by is no more than the very small consumption due to the stray currents of its components;

the period and the duty cycle of the clock-pulse generator can always be adapted to the specific needs of the converter in the various phases of the conversion, so that the consumption is always limited to what is strictly necessary for correctly carrying out the conversion;

the fact that the clock-pulse generator is incorporated in the integrated circuit that comprises the converter makes it possible for the generator to be automatically adapted to the converter. In fact, the variations of the dimensions and the characteristics of the components due to the variability of the manufacturing parameters are the same for the generator and the converter. In particular, one should bear in mind the fact that the oscillation time of the clock-pulse generator is directly proportional to the capacitance of its capacitors and inversely proportional to the current of its constant current generators and that the memorization time of the sample and the times of the SAR operations (Phase 3) of the conversion) become greater as the capacitance of the capacitors increases and smaller as the charging current of the capacitors diminishes: this means that the size and the characteristics of the components vary in the same direction for both the clock-pulse generator and the converter and, consequently, that the consumption of electric energy is undoubtedly optimized with respect to the case of a clock generator outside the integrated circuit, which has to be designed in such a manner as to enable it to cope with all the possible variations of the dimensions and the operating characteristics of the converter components.

Figure 2:
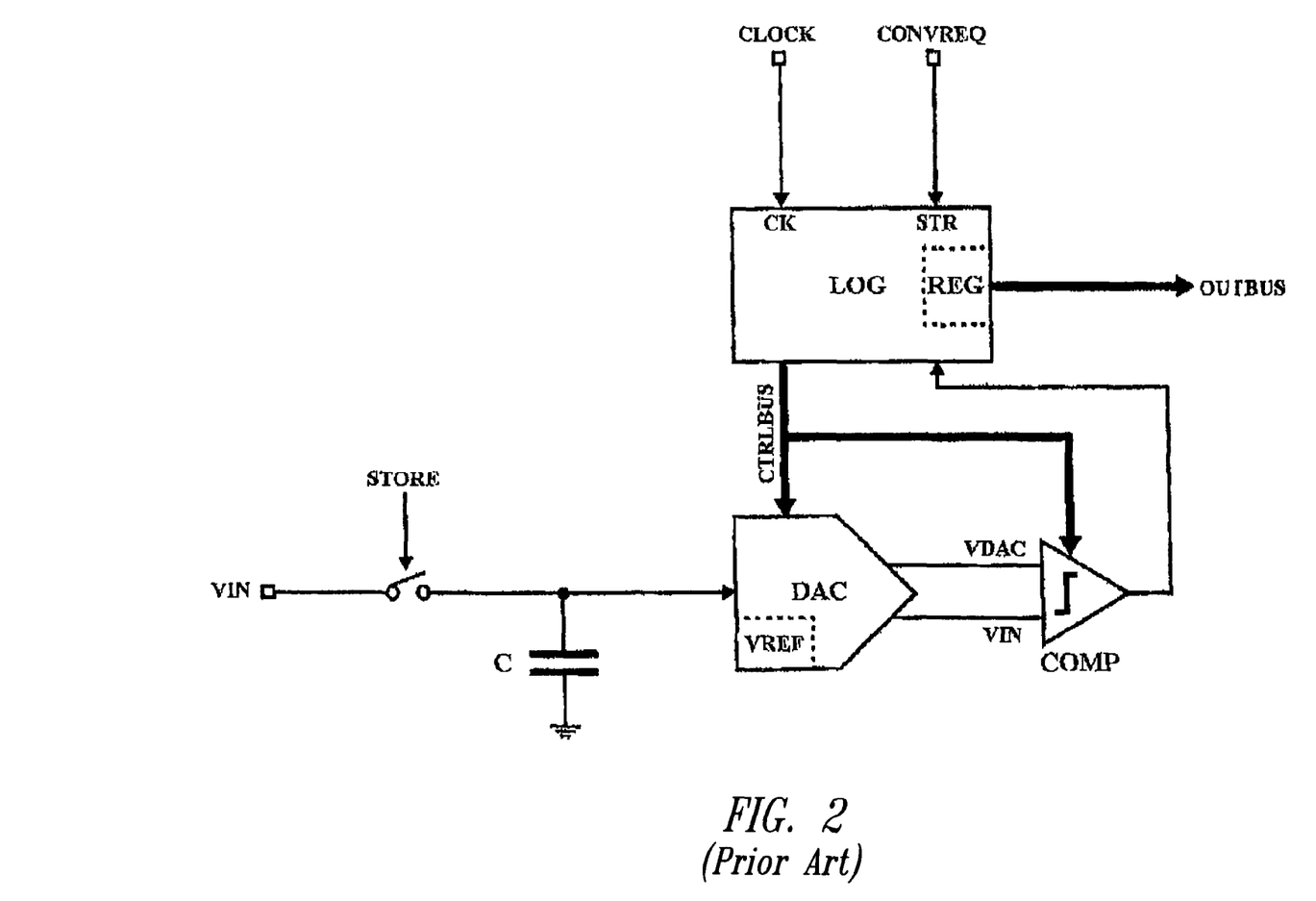

It should also be noted that the converter in accordance with the invention does not call for large-size components like the capacitor described in connection with the known converter of FIG. 2 and can therefore be realized in an integrated circuit of small size.

Figure 10:
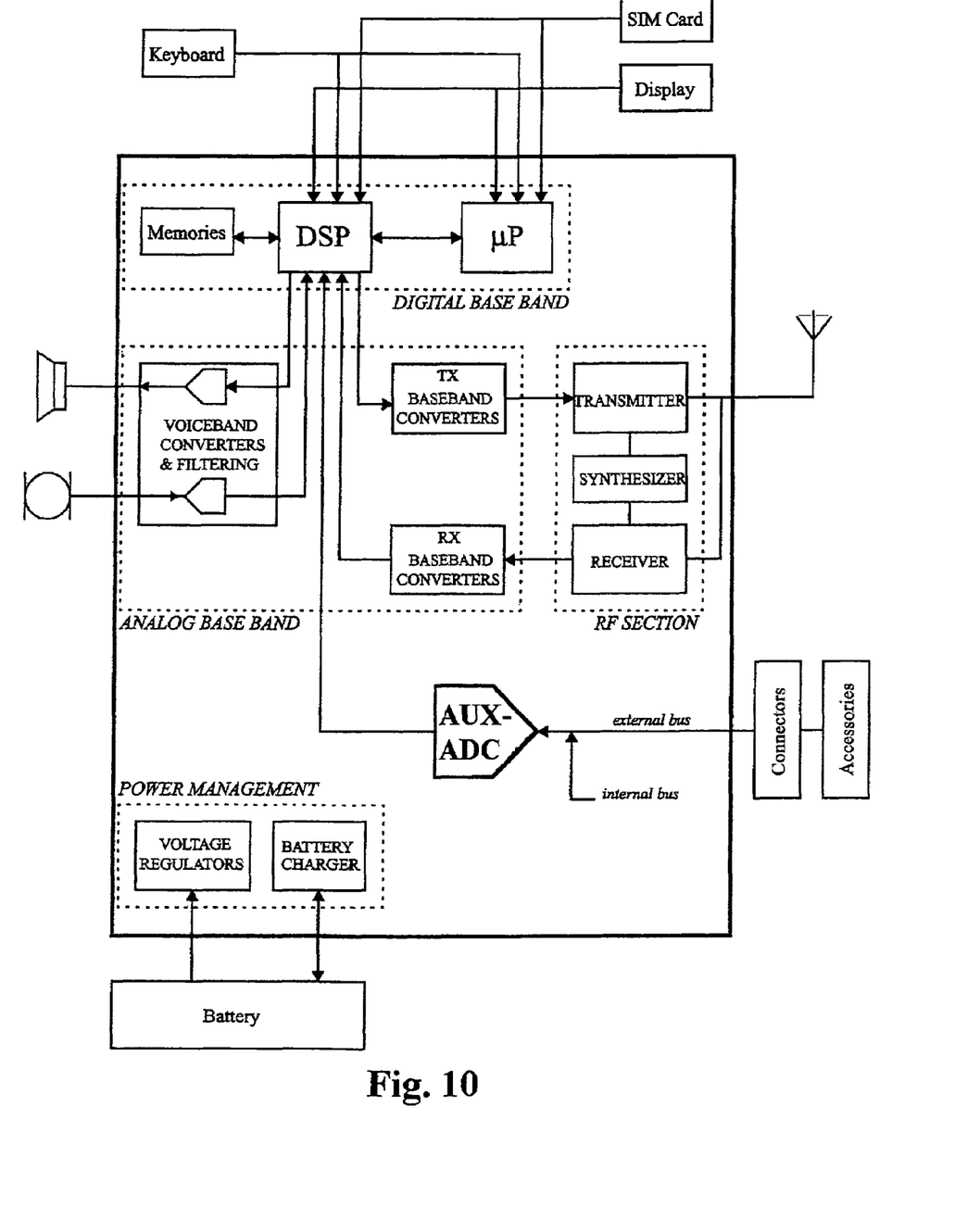

Thanks to these characteristics, the invention is suitable for being advantageously employed in many electronic systems having analog inputs that have to be processed in digital form. In particular, it may be used in a cellular telephone to perform the functions briefly mentioned at the beginning of this description. FIG. 10 shows the schematic layout of the functional blocks of a cellular telephone with an analog-digital converter in accordance with the invention, indicated by AUX ADC (auxiliary analog-digital converter). In the figure the blocks relating to the circuit part of the telephone, preferably realized in three or four integrated-circuit devices, are enclosed within a rectangle delimited by thicker lines. The converter AUX ADC can be integrated into any one of the integrated-circuit devices on the basis of design choices that facilitate realization. The functions of the various blocks are indicated in the figure by words and abbreviations readily understood by a person skilled in the art.

Lastly, it is clear to an expert designer of converters that the invention may be implemented with advantage not only in the form of an analog-digital converter of the SAR type, but also in converters of other types in which a system clock is either not available or its use would not be appropriate and also whenever it is essential to reduce the consumption to the greatest possible extent.

It may also be used in a switched capacitor configuration, see for example patent application-filed by the same applicants on the same day as the present application entitled "Low Consumption and Low Noise Analog-Digital Converter of the Sar Type and Method of Employing it", bearing attorney docket number 851063.497, which claims priority from European Applications 04425241.9 filed Apr. 4, 2004 and 04425242.7 filed Apr. 1, 2004.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An analog-digital converter, comprising:
   quantization means having an input terminal for receiving an analog quantity to be converted;
   a register having an output terminal to provide a digital quantity corresponding to the analog quantity;
   a timing pulse generator on a same integrated circuit as the quantization means; and
   a logic unit coupled to the quantization means, the register and the timing pulse generator, the logic unit capable of responding to a conversion request signal originating from an external requesting unit by activating the quantization means in such a manner as to make the quantization means carry out operations timed by the timing pulses and load into the register the digital quantity to be provided at the output terminal,
   the logic unit being capable of generating a stop signal for an oscillator, and the timing pulse generator including the oscillator capable of being started and stopped by a binary signal applied to its activation input terminal; and the logic unit including means for generating the binary signal to apply to the activation input terminal of the oscillator, said binary signal assuming a first or a second binary state corresponding, respectively, to activation and deactivation of the oscillator in response to, respectively, the conversion request signal and the stop signal for the oscillator.

2. The converter in accordance with claim 1 wherein the logic unit comprises a counter to manage the timed operations having a reset input terminal and wherein the means for generating the binary signal to be applied to the activation input terminal of the oscillator comprise a generator of single pulses that has an input terminal for the conversion request signal and an output terminal functionally coupled with the reset input terminal of the counter and the activation input terminal of the oscillator.

3. The converter in accordance with claim 2 wherein the means for generating a binary signal to be applied to the activation input terminal of the oscillator comprises means for delaying the start-up of the oscillator for a period of time equal to a duration of a single pulse.

4. The converter in accordance with claim 3 wherein the means for generating the binary signal to be applied to the activation input terminal of the oscillator comprises an OR gate having its output terminal coupled to the activation input terminal of the oscillator and two input terminals coupled in such a manner as to receive the single pulses of the generator of single pulses and the stop signal.

5. The converter in accordance with claim 2 wherein the means for generating the binary signal to be applied to the activation input terminal of the oscillator comprises a second generator of single pulses that has an input terminal for the conversion request signal and an output terminal functionally coupled with the logic means for activating the generation of the stop signal of the oscillator and with the activation input terminal of the oscillator.

6. The converter in accordance with claim 5 wherein the means for generating the binary signal to be applied to the activation input terminal of the oscillator comprises means for delaying the start-up of the oscillator for a period of time equal to the duration of a single pulse of the second generator of single pulses.

7. The converter in accordance with claim 6 wherein the means for generating the binary signal to be applied to the activation input terminal of the oscillator comprise an OR gate having its output terminal coupled to the activation input terminal of the oscillator and three input terminals coupled in such a manner as to receive the single pulses of the generator of single pulses, the single pulses of the further generator of single pulses and the stop signal.

8. The converter in accordance with claim 1 wherein the oscillator of the timing pulse generator comprises:
  a first ring oscillator comprising an odd number of inverting elements, a delay element and an output terminal, the delay element being capable of responding to a pulse at its input terminal with a delay with respect to an edge of the input pulse and substantially without delay with respect to another edge of the input pulse;
  a second ring oscillator comprising an odd number of inverting elements, a delay element and an output terminal connected to the output terminal of the first oscillator, the delay element being capable of responding to a pulse at its input terminal with a delay with respect to an edge of the input pulse and substantially without delay with respect to another edge of the input pulse;
  a bistable logic circuit having an output terminal connected to a common output terminal of the first and the second oscillators; and
  wherein at least one of the inverting elements of the first oscillator and at least one of the inverting elements of the second oscillator form part of the bistable logic circuit.

9. The converter in accordance with claim 8 wherein at least one of the delay elements of the first and the second oscillator comprises means for regulating the delay.

10. A cellular telephone comprising an analog-digital converter in accordance with claim 1.

11. An apparatus, comprising:
  a digital-to-analog converter to receive on a first input terminal an analog signal to be converted to a digital signal;
  a logic unit coupled to the digital-to-analog converter to output on an output terminal a digital value corresponding to the analog signal received at the input terminal of the digital-to-analog converter; and
  a timing pulse generator circuit on a same integrated circuit substrate as the logic unit, the timing pulse generator circuit being coupled to provide clock pulses to the logic unit and having an activation input terminal capable of being started and stopped,
  wherein a further output terminal of the logic unit is coupled to the activation input terminal of the timing pulse generator to start and stop the timing pulse generator in response to a conversion request signal.

12. The apparatus according to claim 11 wherein the further output terminal of the logic unit is coupled to apply a binary signal to the activation input terminal of the timing pulse generator.

13. The apparatus according to claim 12 wherein the binary signal has a first binary state or a second binary state respectively corresponding to an activation or a deactivation of the timing pulse generator in response to the conversion request signal.

* * * * *